US010191381B2

(12) United States Patent
Yabu

(10) Patent No.: US 10,191,381 B2
(45) Date of Patent: Jan. 29, 2019

(54) EXTREME ULTRAVIOLET LIGHT GENERATING DEVICE

(71) Applicant: Gigaphoton Inc., Tochigi (JP)

(72) Inventor: Takayuki Yabu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/941,858

(22) Filed: Mar. 30, 2018

(65) Prior Publication Data
US 2018/0224746 A1 Aug. 9, 2018

Related U.S. Application Data

(63) Continuation of application No. PCT/JP2015/081118, filed on Nov. 5, 2015.

(51) Int. Cl.
H05G 2/00 (2006.01)
G03F 7/20 (2006.01)
G21K 1/06 (2006.01)

(52) U.S. Cl.
CPC .......... *G03F 7/70033* (2013.01); *G03F 7/20* (2013.01); *G21K 1/062* (2013.01); *H05G 2/00* (2013.01); *H05G 2/008* (2013.01)

(58) Field of Classification Search
CPC ........ H05G 2/003; H05G 2/008; H05G 2/006; H05G 2/005; H05G 1/00; G03F 7/70175; G03F 7/70166; G03F 7/70575; G03F 7/20; G03F 7/7005; G03F 7/70916; G21K 2201/061; G21K 2201/064; G21K 1/062; G21K 1/067; G21K 1/06; G21K 5/02
(Continued)

(56) References Cited

U.S. PATENT DOCUMENTS 9,316,918 B2 * 4/2016 Mann ................... G03F 7/70175
2003/0096302 A1 5/2003 Yguerabide et al.
(Continued)

FOREIGN PATENT DOCUMENTS

JP H09-502254 A 3/1997
JP 2005-507489 A 3/2005
(Continued)

OTHER PUBLICATIONS

International Preliminary Report on Patentability issued in PCT/JP2015/081118; dated May 8, 2018.

*Primary Examiner* — David A Vanore
(74) *Attorney, Agent, or Firm* — Studebaker & Brackett PC

(57) ABSTRACT

An extreme ultraviolet (EUV) light generator includes a generation region where a target generates EUV light, a mirror that focuses the EUV light, an illumination light source, and a light receiver to receive reflected light from the target. A reflection surface of the mirror defines first and second focuses at the generation region and a mirror focal point, respectively. A line segment that links a reflection surface outer peripheral edge and the first focus is rotated about an axis through the first and second focuses to form a first limit surface. The line segment and an extended line on the outer peripheral side rotated about the axis forms a second limit surface. At least one of an illumination light optical path and a reflected light optical path from the light source and the light receiver, respectively, passes through the first focus and extends between the first and second limit surfaces.

6 Claims, 10 Drawing Sheets

(58) Field of Classification Search
USPC .............. 250/504 R, 201.2, 216, 372, 492.2, 250/492.22, 493.1; 359/350, 359, 355, 359/361, 859
See application file for complete search history.

(56) References Cited

U.S. PATENT DOCUMENTS

| | | |
|---|---|---|
| 2005/0205810 A1 | 9/2005 | Akins et al. |
| 2008/0230726 A1* | 9/2008 | Shirai .................... B82Y 10/00 250/504 R |
| 2009/0244696 A1* | 10/2009 | Geyl ................... G03F 7/70175 359/359 |
| 2009/0267003 A1* | 10/2009 | Moriya ................. B82Y 10/00 250/492.22 |
| 2010/0140512 A1 | 6/2010 | Suganuma et al. |
| 2013/0037693 A1* | 2/2013 | Moriya ................. G02B 27/16 250/201.2 |
| 2013/0228695 A1* | 9/2013 | Mizoguchi ......... G02B 19/0095 250/372 |
| 2013/0319466 A1 | 12/2013 | Mizoguchi et al. |
| 2014/0111635 A1* | 4/2014 | Suzuki ................... H05G 2/008 348/86 |
| 2018/0224748 A1* | 8/2018 | Nagai ....................... G03F 7/20 |

FOREIGN PATENT DOCUMENTS

| | | |
|---|---|---|
| JP | 2007-528607 A | 10/2007 |
| JP | 2010-123942 A | 6/2010 |
| JP | 2013-251381 A | 12/2013 |
| JP | 2014-086523 A | 5/2014 |
| WO | 95/09354 A1 | 4/1995 |

* cited by examiner

FIG.5

| CONDITION | FIRST REGION | SECOND REGION | STRAY LIGHT |
|---|---|---|---|
| 1 | LIGHT RECEIVING UNIT | LIGHT SOURCE UNIT | NO |
| 2 | - | LIGHT SOURCE UNIT, LIGHT RECEIVING UNIT | NO |
| 3 | LIGHT SOURCE UNIT | LIGHT RECEIVING UNIT | NO |
| 4 | LIGHT SOURCE UNIT, LIGHT RECEIVING UNIT | - | CAPTURED |

EXTREME ULTRAVIOLET LIGHT GENERATING DEVICE

CROSS-REFERENCE TO RELATED APPLICATIONS

The present application is a continuation application of International Application No. PCT/JP2015/081118 filed on Nov. 5, 2015. The content of the application is incorporated herein by reference in its entirety.

BACKGROUND

1. Technical Field

The present disclosure relates to an extreme ultraviolet light generating device.

2. Related Art

Along with microfabrication of a semiconductor process in recent years, microfabrication of a transfer pattern in the photolithography of the semiconductor process has been progressing rapidly. In the next generation, microfabrication of 20 nm or smaller will be required. Accordingly, it is expected to develop an exposure device that has an extreme ultraviolet (EUV) light generating device that generates extreme ultraviolet (EUV) light having a wavelength of about 13 nm and a reflection reduction projection optical system in combination.

As EUV light generating devices, three types of devices are proposed: an LPP (Laser Produced Plasma) type device that uses plasma generated when a target is irradiated with laser light, a DPP (Discharge Produced Plasma) type device that uses plasma generated by discharging, and an SR (Synchrotron Radiation) type device that uses orbital radiation light.

CITATION LIST

Patent Literature

Patent Literature 1: National Publication of International Patent Application No. 2007-528607
Patent Literature 2: National Publication of International Patent Application No. 2005-507489
Patent Literature 3: National Publication of International Patent Application No. 09-502254

SUMMARY

An extreme ultraviolet light generating device, according to one aspect of the present disclosure, may include a chamber, a focusing mirror, a light source unit, and a light receiving unit. In the chamber, extreme ultraviolet light may be generated from a target supplied to a generation region. The focusing mirror may be configured to reflect the extreme ultraviolet light, generated in the generation region, by a reflection surface, and focus the light at a predetermined focal point farther from the reflection surface than the generation region. The light source unit may be connected with the chamber, and may be configured to output illumination light toward the target to be supplied to the generation region. The light receiving unit may be connected with the chamber, and may be configured to receive reflected light from the target, of the illumination light output toward the target, and capture an image of the target. The reflection surface of the focusing mirror may be formed in a spheroidal face that defines a first focus at the generation region and a second focus at the predetermined focal point. Assuming that a surface formed when an extended line, on the first focus side, of a line segment linking the outer peripheral edge of the reflection surface and the first focus is rotated about an axis passing through the first focus and the second focus, is a first limit surface, and assuming that a surface formed when the line segment linking the outer peripheral edge of the reflection surface and the first focus and an extended line, on the outer peripheral side, of the line segment are rotated about the axis passing through the first focus and the second focus, is a second limit surface, the light source unit and the light receiving unit may be disposed such that at least one of an optical path of the illumination light and an optical path of the reflected light passes through the first focus and is included in an internal space of the chamber located between the first limit surface and the second limit surface.

BRIEF DESCRIPTION OF THE DRAWINGS

Some embodiments of the present disclosure will be described below as just examples with reference to the accompanying drawings.

FIG. 5 illustrates results of verifying relationship between positions of a light source unit and a light receiving unit and stray light under conditions 1 to 4;

EMBODIMENTS

Figure 1:
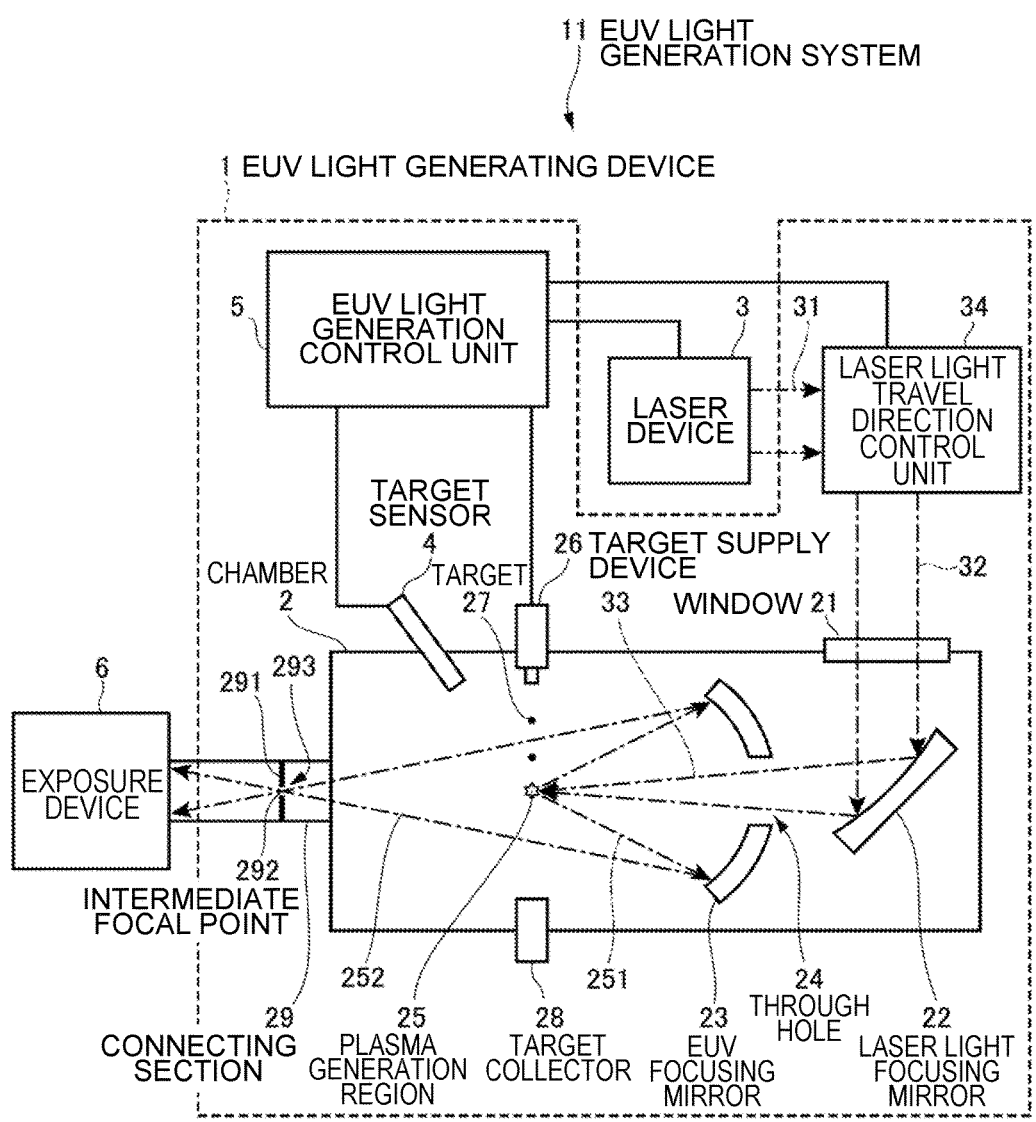
FIG. 1 schematically illustrates a configuration of an exemplary LPP type EUV light generation system.

Contents
1. Overall description of EUV light generation system
1.1 Configuration
1.2 Operation
2. Terms
3. Problem
3.1 Configuration of comparative example
3.2 Operation of comparative example
3.3 Problem
4. First embodiment
4.1 Configuration
4.2 Operation
4.3 Effect
5. Second embodiment
5.1 Configuration
5.2 Operation
5.3 Effect 6. Third embodiment
6.1 Configuration
6.2 Operation
6.3 Effect
7. Fourth embodiment
7.1 Configuration
7.2 Effect
8. Others Hereinafter, embodiments of the present disclosure will be described in detail with reference to the drawings. The embodiments described below illustrate some examples of the present disclosure, and do not limit the contents of the present disclosure. All of the configurations and the operations described in the embodiments are not always indispensable as configurations and operations of the present disclosure. It should be noted that the same constituent elements are denoted by the same reference signs, and overlapping description is omitted.

1. Overall Description of EUV Light Generation System

1.1 Configuration

FIG. 1 schematically illustrates a configuration of an exemplary LPP type EUV light generation system.

An EUV light generating device 1 may be used together with at least one laser device 3. In the present application, a system including the EUV light generating device 1 and the laser device 3 is called an EUV light generation system 11. As illustrated in FIG. 1 and described below in detail, the EUV light generating device 1 may include a chamber 2 and a target supply device 26. The chamber 2 may be sealable. The target supply device 26 may be mounted so as to penetrate a wall of the chamber 2. The material of the target 27 to be supplied from the target supply device 26 may include, but not limited to, tin, terbium, gadolinium, lithium, xenon, or a combination of any two or more of them.

A wall of the chamber 2 may have at least one through hole. The through hole may be provided with a window 21. Pulse laser light 32 output from the laser device 3 may penetrate the window 21. The inside of the chamber 2 may be provided with an EUV focusing mirror 23 having a spheroidal reflection surface. The EUV focusing mirror 23 may have a first focus and a second focus. On the surface of the EUV focusing mirror 23, a multilayer reflection film in which molybdenum and silicon are alternately layered may be formed. It is preferable that the EUV focusing mirror 23 is disposed such that the first focus is positioned in a plasma generation region 25 and the second focus is positioned at an intermediate focal point (IF) 292, for example. A center portion of the EUV focusing mirror 23 may be provided with a through hole 24 through which pulse laser light 33 may pass.

The EUV light generating device 1 may include an EUV light generation control unit 5, a target sensor 4, and the like. The target sensor 4 may have an image capturing function, and may be configured to detect presence, trajectory, position, velocity, and the like of the target 27.

The EUV light generating device 1 may also include a connecting section 29 that allows the inside of the chamber 2 and the inside of an exposure device 6 to communicate with each other. The inside of the connecting section 29 may be provided with a wall 291 having an aperture 293. The wall 291 may be disposed such that the aperture 293 is positioned at the second focus of the EUV focusing mirror 23.

The EUV light generating device 1 may also include a laser light travel direction control unit 34, a laser light focusing mirror 22, a target collector 28 configured to collect the target 27, and the like. The laser light travel direction control unit 34 may include an optical element configured to define the travel direction of the laser light, and an actuator configured to adjust the position, posture, and the like of the optical element.

1.2 Operation

Referring to FIG. 1, pulse laser light 31 output from the laser device 3 may pass through the laser light travel direction control unit 34, penetrate the window 21 as the pulse laser light 32, and may be made incident on the chamber 2. The pulse laser light 32 may travel inside the chamber 2 along at least one optical path of the laser light, may be reflected by the laser light focusing mirror 22, and may be radiated to at least one target 27 as the pulse laser light 33.

The target supply device 26 may be configured to output the target 27 toward the plasma generation region 25 in the chamber 2. The target 27 may be irradiated with at least one pulse included in the pulse laser light 33. The target 27 irradiated with the pulse laser light 33 is made into plasma, and from the plasma, EUV light 251 may be radiated along with radiation of light having another wavelength. The EUV light 251 may be selectively reflected by the EUV focusing mirror 23. EUV light 252 reflected by the EUV focusing mirror 23 may be focused at the intermediate focal point 292, and output to the exposure device 6. It should be noted that one target 27 may be irradiated with a plurality of pulses included in the pulse laser light 33.

The EUV light generation control unit 5 may be configured to preside over the control of the entire EUV light generation system 11. The EUV light generation control unit 5 may be configured to process image data or the like of the target 27 captured by the target sensor 4. Further, the EUV light generation control unit 5 may perform at least one of control of the output timing of the target 27 and control of the output direction and the like of the target 27, for example. Furthermore, the EUV light generation control unit 5 may perform at least one of control of the output timing of the laser device 3, control of the travel direction of the pulse laser light 32, and control of the focusing position of the pulse laser light 33, for example. The aforementioned various types of control are mere examples, and another type of control may be added when necessary.

2. Terms

"Target" is an object to be irradiated with laser light introduced to the chamber. The target irradiated with laser light is made into plasma and emits EUV light.

"Droplet" is a form of a target to be supplied to the chamber.

"Plasma generation region" is a predetermined region in the chamber. Plasma generation region is a region where a target output to the chamber is irradiated with laser light, and the target is made into plasma.

"Target trajectory" is a path on which a target output to the chamber travels. Target trajectory may intersect an optical path of the laser light introduced to the chamber in the plasma generation region.

"Optical path axis" is an axis passing through the center of a beam cross section of the light along the travel direction of the light.

"Optical path" is a path through which the light passes. Optical path may include the optical path axis.

3. Problem

An EUV light generating device 1 of a comparative example will be described with use of FIGS. 2 and 3.

The EUV light generating device 1 of the comparative example may be the EUV light generating device 1 including the target sensor 4.

3.1 Configuration of Comparative Example

Figure 2:
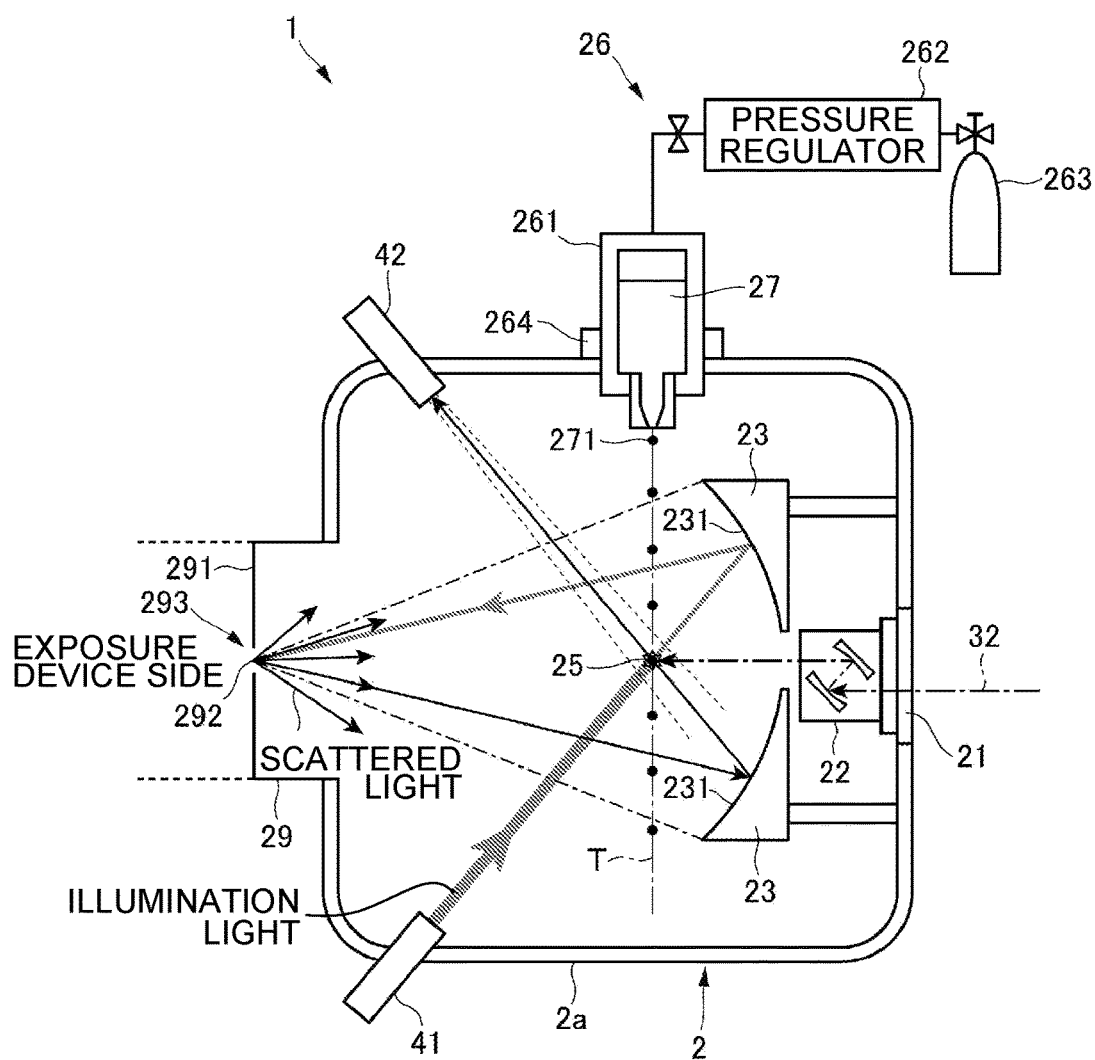
FIG. 2 is a diagram for explaining a configuration of an EUV light generating device of a comparative example.

FIG. 2 is a diagram for explaining the configuration of the EUV light generating device 1 of the comparative example.

The EUV light generating device 1 of the comparative example may include the chamber 2, the target supply device 26, and the target sensor 4.

The chamber 2 may be a container in which the target 27 supplied to the inside by the target supply device 26 is irradiated with the pulse laser light 33 whereby EUV light 252 is generated, as described above.

In the chamber 2, the laser light focusing mirror 22 and the EUV focusing mirror 23 may be provided.

The laser light focusing mirror 22 may reflect the pulse laser light 32 passing through the window 21 and made incident thereon. The laser light focusing mirror 22 may focus the reflected pulse laser light 32 in the plasma generation region 25 as the pulse laser light 33.

The EUV focusing mirror 23 may selectively reflect, by a reflection surface 231, light having a wavelength near a particular wavelength, of the EUV light 251 generated in the plasma generation region 25. The EUV focusing mirror 23 may focus the selectively reflected EUV light 251 at the intermediate focal point 292 that is a predetermined focal point, as the EUV light 252.

The reflection surface 231 of the EUV focusing mirror 23 may be formed in a spheroidal face having a first focus F1 and a second focus F2.

The first focus F1 may be located in the plasma generation region 25. The second focus F2 may be located at the intermediate focal point 292 that is farther from the reflection surface 231 than the plasma generation region 25.

The target supply device 26 may be a device that melts the target 27 supplied to the chamber 2 and outputs it as a droplet 271 to the plasma generation region 25 in the chamber 2. The target supply device 26 may be a device that outputs the droplet 271 in a so-called continuous jet method.

Operation of the target supply device 26 may be controlled by the EUV light generation control unit 5.

The target supply device 26 may include a tank 261, a pressure regulator 262, a gas cylinder 263, and a biaxial stage 264.

The tank 261 may contain the target 27 to be supplied to the chamber 2, in a molten state.

The pressure regulator 262 may regulate the pressure when the inert gas in the gas cylinder 263 is supplied to the tank 261, to thereby regulate the pressure applied to the target 27 contained in the tank 261. Thereby, the pressure regulator 262 may regulate the velocity of the target 27 output from the inside of the tank 261 into the chamber 2 to a desired velocity.

The biaxial stage 264 may move the tank 261 in a direction almost parallel to the X axis and the Y axis of a coordinate system described below with use of FIG. 4, to thereby regulate a target trajectory T of the target 27 output to the chamber 2 to be a desired trajectory passing through the plasma generation region 25.

The target sensor 4 may detect the target 27 supplied to the plasma generation region 25.

Specifically, the target sensor 4 may capture an image of the target 27 supplied to the plasma generation region 25, and measure the position, the velocity, or the target trajectory T of the target 27.

Operation of the target sensor 4 may be controlled by the EUV light generation control unit 5.

The target sensor 4 may include a light source unit 41 and a light receiving unit 42.

The light source unit 41 may output illumination light toward the target 27 supplied to the plasma generation region 25.

Specifically, the light source unit 41 may output illumination light to the first focus F1 located in the plasma generation region 25 and the vicinity of the first focus F1. The vicinity of the first focus F1 may be a region on the target trajectory T on the target supply device 26 side from the first focus F1.

The light source unit 41 may be configured with use of a CW (Continuous Wave) laser that outputs continuous single-wavelength laser light, for example. Alternatively, the light source unit 41 may be configured with use of a lamp that outputs continuous light having multiple wavelengths, or the like.

The light source unit 41 may be connected to a wall 2a of the chamber 2.

The light source unit 41 may be disposed such that the emission port of the illumination light faces the first focus F1 located in the plasma generation region 25.

The light receiving unit 42 may receive the reflected light from the target 27 to thereby capture an image of the target 27.

The reflected light from the target 27 may be illumination light reflected by the target 27, of the illumination light output from the light source unit 41 toward the target 27 supplied to the plasma generation region 25.

Specifically, the light receiving unit 42 may receive reflected light from the target 27 located at the first focus F1 in the plasma generation region 25 and the vicinity of the first focus F1, to thereby capture an image of the target 27.

The light receiving unit 42 may be configured with use of an image sensor such as a CCD (Charge-Coupled Device), for example.

The light receiving unit 42 may be connected with the wall 2a of the chamber 2.

The light receiving unit 42 may be disposed on the optical path of the reflected light from the target 27.

The light receiving unit 42 may be disposed such that an incident port of the reflected light from the target 27 faces the first focus F1 located in the plasma generation region 25.

3.2 Operation of Comparative Example

Operation of the EUV light generating device 1 of the comparative example will be described.

The target supply device 26 may output the target 27 contained in the tank 261 to the chamber 2. The output target 27 may travel on the target trajectory T toward the plasma generation region 25.

The light source unit 41 may output illumination light to the first focus F1 located in the plasma generation region 25 and the vicinity of the first focus F1.

When the target 27 output to the chamber 2 passes through the first focus F1, the illumination light output from the light source unit 41 may be radiated to the target 27. The light radiated to the target 27 may be reflected at the surface of the target 27. The reflected light from the target 27 may be received by the light receiving unit 42.

The light receiving unit 42 may capture an image of the reflected light from the target 27. The light receiving unit 42 may acquire an image of the target 27. The light receiving unit 42 may measure the position, the velocity, or the target trajectory T of the target 27 from the acquired image. The light receiving unit 42 may transmit a signal representing the measurement result to the EUV light generation control unit 5.

The EUV light generation control unit 5 may control the target supply device 26 based on the measurement result to thereby control the position, the velocity, or the target trajectory T of the target 27.

3.3 Problem

Figure 3:
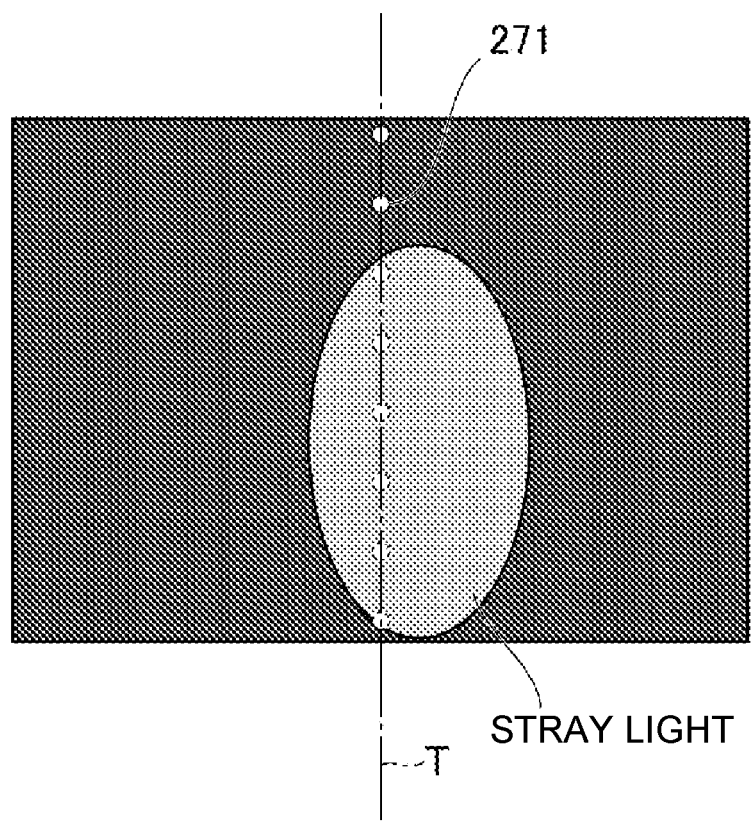
FIG. 3 is an illustration for explaining a problem in the EUV light generating device of the comparative example.

FIG. 3 is a diagram for explaining the problem in the EUV light generating device 1 of the comparative example.

The light receiving unit 42 of the target sensor 4 may receive reflected light from the target 27 and capture an image of the target 27, as described above.

However, the light receiving unit 42 may capture an image of stray light, depending on the positions of the light source unit 41 and the light receiving unit 42. Stray light may be light unnecessary for measuring the position, the velocity, or the target trajectory T of the target 27, of the light received by the light receiving unit 42. Stray light may be light other than the reflected light from the target 27.

In particular, illumination light output from the light source unit 41 may pass through the first focus F1 without being radiated to the target 27, and may be made incident on the reflection surface 231 of the EUV focusing mirror 23. In that case, the illumination light made incident on the reflection surface 231 may be reflected by the reflection surface 231, and reach the second focus F2 located at the intermediate focal point 292. The illumination light that reached the second focus F2 may be scattered by the wall 291 and the like existing around the second focus F2. At that time, part of the scattered light caused by the wall 291 and the like may be made incident on the reflection surface 231 again, and reflected by the reflection surface 231 again. In that case, the scattered light reflected by the reflection surface 231 may pass through the first focus F1, may be received by the light receiving unit 42, and may be captured as stray light.

When the light receiving unit 42 captures an image of the stray light, the stray light may be reflected in an image acquired by the light receiving unit 42 such that it overlaps the image of the target 27, as illustrated in FIG. 3.

Thereby, the light receiving unit 42 hardly recognizes the image of the target 27 correctly from the acquired image, and it is hard to measure the position, the velocity, or the target trajectory T of the target 27 correctly. Consequently, an error included in the measurement result may be large.

Accordingly, it is desired to have a technology that enables the target 27 to be measured with high accuracy by suppressing the stray light that may be captured by the light receiving unit 42.

4. First Embodiment

An EUV light generating device 1 of a first embodiment will be described with use of FIGS. 4 to 6.

The EUV light generating device 1 of the first embodiment may be different from the EUV light generating device 1 of the comparative example in the positions of the light source unit 41 and the light receiving unit 42.

Regarding the configuration of the EUV light generating device 1 of the first embodiment, description of the same parts as the EUV light generating device 1 of the comparative example is omitted.

Figure 4:
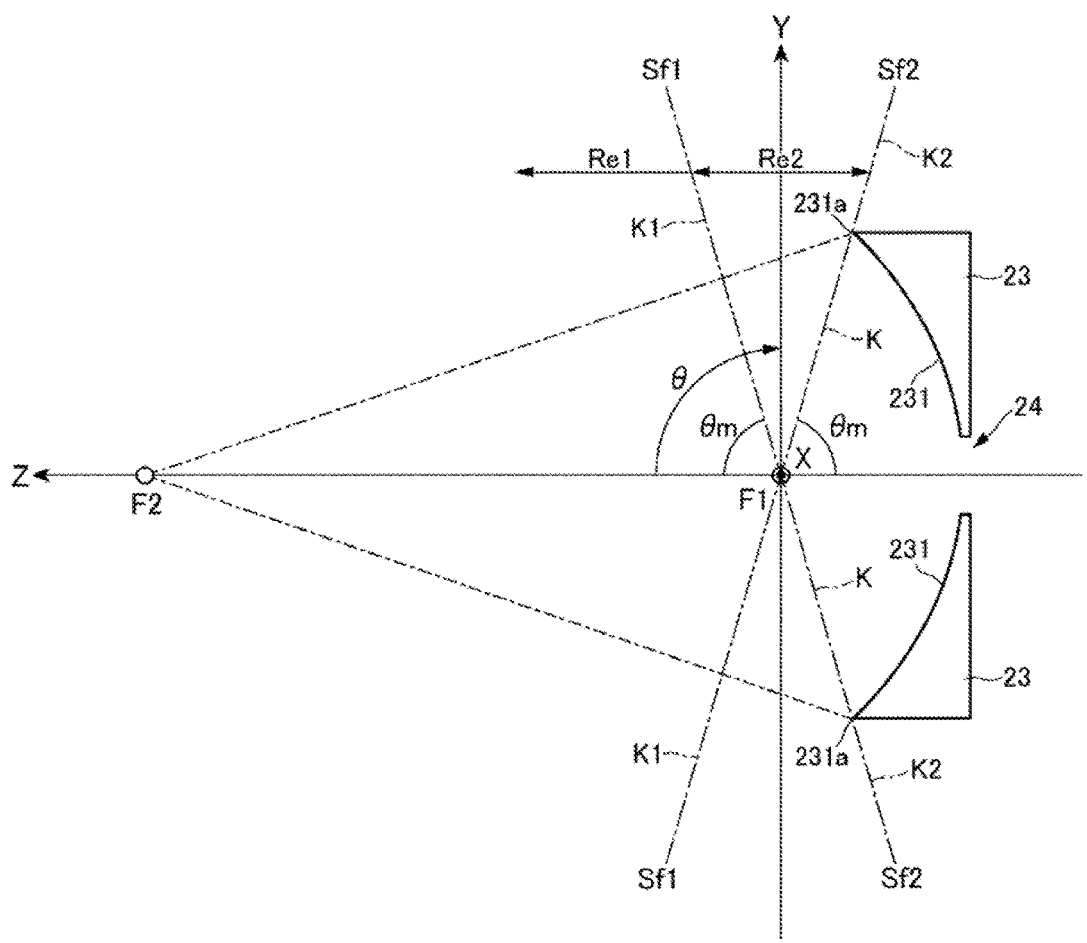
FIG. 4 illustrates an internal space of a chamber including an EUV focusing mirror, a first focus, and a second focus.

FIG. 4 illustrates the internal space of the chamber 2 including the EUV focusing mirror 23, the first focus F1, and the second focus F2.

In the coordinate system illustrated in FIG. 4, the first focus F1 located in the plasma generation region 25 is set to be the origin.

In the coordinate system illustrated in FIG. 4, an axis passing through the first focus F1 and the second focus F2 is assumed to be the Z axis. The Z axis direction may be a direction from the first focus F1 toward the second focus F2. The Z axis direction may be a direction that the EUV light 252 is output from the chamber 2 to the exposure device 6.

In the coordinate system illustrated in FIG. 4, an axis passing through the target supply device 26 and the plasma generation region 25 is assumed to be the Y axis. The Y axis direction may be a direction opposite to the direction that the target supply device 26 outputs the target 27 to the chamber 2. The Y axis may overlap the target trajectory T.

In the coordinate system illustrated in FIG. 4, an axis orthogonal to the Y axis and the Z axis is assumed to be the X axis.

Here, it is assumed that a line segment linking an outer peripheral edge 231a of the reflection surface 231 and the first focus F1 is a line segment K.

An acute angle defined by the line segment K and the Z axis is assumed to be $\theta_m$. $\theta_m$ may be 45° or larger but 90° or smaller, for example. $\theta_m$ may be any of 45°, 50°, 55°, 60°, 65°, 70°, 75°, 80°, and 85°, for example. $\theta_m$ may be 84°, for example.

An extended line on the first focus F1 side of the line segment K is assumed to be K1. An acute angle defined by the extended line K1 and the Z axis may be $\theta_m$.

An extended line on the outer peripheral edge 231a side of the line segment K is assumed to be K2. An acute angle defined by the extended line K2 and the Z axis may be $\theta_m$.

A face formed when the extended line K1 is rotated $2\pi$ [rad] about the Z axis is assumed to be a first limit surface Sf1. The first limit surface Sf1 may be in a form like a side face of a cone opened to the second focus F2 side, where the apex is the first focus F1 and the half vertical angle is $\theta_m$.

A face formed when the line segment K and the extended line K2 are rotated a [rad] about the Z axis is assumed to be a second limit surface Sf2. The second limit surface Sf2 may be in a form like a side face of a cone opened to the reflection surface 231 side, where the apex is the first focus F1 and the half vertical angle is $\theta_m$.

In the internal space of the chamber 2, a region of the second focus F2 side at least from the first limit surface Sf1 is assumed to be a first region Re1.

In the internal space of the chamber 2, a region between the first limit surface Sf1 and the second limit surface Sf2 is assumed to be a second region Re2.

Whether or not an image of stray light is captured in the light receiving unit 42 may depend on the positions of the light source unit 41 and the light receiving unit 42.

FIG. 5 illustrates results of verifying the relationship between the positions of the light source unit 41 and the light receiving unit 42 and stray light under conditions 1 to 4.

Condition 1 is the case where the optical path of the illumination light output from the light source unit 41 passes through the first focus F1 and is included in the second region Re2, and the optical path of the reflected light from the target 27 to be received by the light receiving unit 42 passes through the first focus F1 and is included in the first region Re1.

In the case of condition 1, a verification result that an image of stray light was less likely to be captured by the light receiving unit 42 was obtained.

Condition 2 is the case where the optical path of the illumination light output from the light source unit 41 passes through the first focus F1 and is included in the second region Re2, and the optical path of the reflected light from the target 27 to be received by the light receiving unit 42 passes through the first focus F1 and is included in the second region Re2.

In the case of condition 2, a verification result that an image of stray light was less likely to be captured by the light receiving unit 42 was obtained.

Condition 3 is the case where the optical path of the illumination light output from the light source unit 41 passes through the first focus F1 and is included in the first region Re1, and the optical path of the reflected light from the target 27 to be received by the light receiving unit 42 passes through the first focus F1 and is included in the second region Re2.

In the case of condition 3, a verification result that an image of stray light was less likely to be captured by the light receiving unit 42 was obtained.

Condition 4 is the case where the optical path of the illumination light output from the light source unit 41 passes through the first focus F1 and is included in the first region Re1, and the optical path of the reflected light from the target 27 to be received by the light receiving unit 42 passes through the first focus F1 and is included in the first region Re1.

In the case of condition 4, a verification result that an image of stray light was likely to be captured by the light receiving unit 42 was obtained.

This means that when at least one of the optical path of the illumination light output from the light source unit 41 and the optical path of the reflected light from the target 27 to be received by the light receiving unit 42 passes through the first focus F1 and is included in the second region Re2, an image of stray light is less likely to be captured by the light receiving unit 42.

In other words, it is preferable that the light source unit 41 and the light receiving unit 42 are disposed such that at least one of the optical path of the illumination light and the optical path of the reflected light from the target 27 passes through the first focus F1 and is included in the internal space of the chamber 2 between the first limit surface Sf1 and second limit surface Sf2.

Further, the internal space of the chamber 2 illustrated in FIG. 4 may be described with use of a polar coordinate system.

In the polar coordinate system illustrated in FIG. 4, the first focus F1 located in the plasma generation region 25 may be the polar.

In the polar coordinate system illustrated in FIG. 4, a distance from the first focus F1 that is the polar may be a radius vector, and an angle of the radius vector with respect to the Z axis may be a deflection angle θ [rad]. The deflection angle θ may be a rotation angle when the radius vector is rotated with respect to the Z axis, with the first focus F1, that is, the polar, being the center of rotation.

In the case of describing the internal space of the chamber 2 illustrated in FIG. 4 with use of the polar coordinate system, the first region Re1 may be described as Expression 1, and the second region Re2 may be described as Expression 2.

In that case, the light source unit 41 and the light receiving unit 42 may be disposed such that at least one of the optical path of the illumination light and the optical path of the reflected light from the target 27 passes through the first focus F1 and is included in the internal space of the chamber 2 described by the deflection angle θ satisfying Expression 2 representing the second region Re2.

$$0 < \theta \leq \theta_m \quad \text{[Expression 1]}$$

$$\theta_m < \theta < (\pi - \theta_m) \quad \text{[Expression 2]}$$

4.1 Configuration

Figure 6:
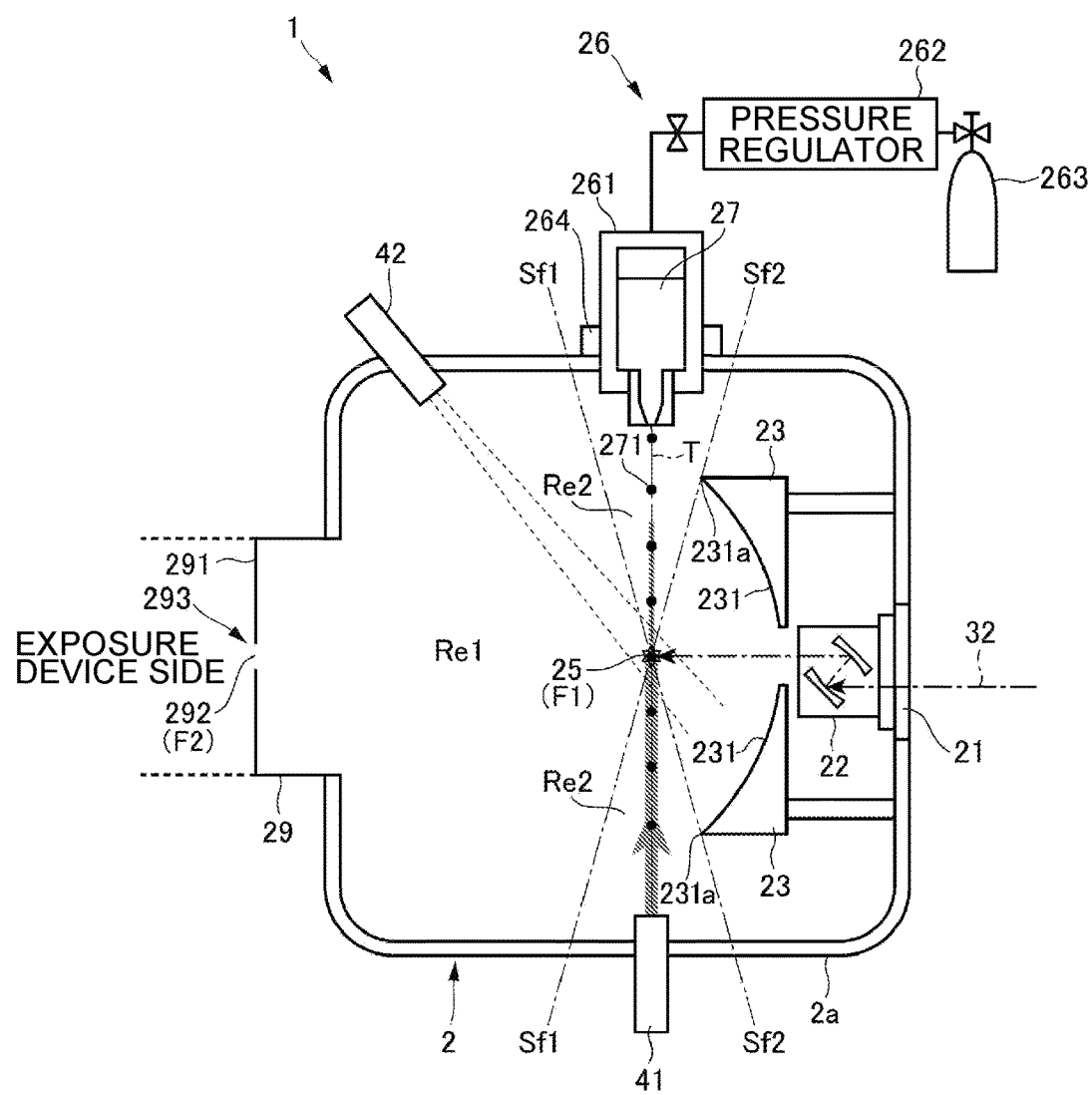
FIG. 6 is a diagram for explaining an EUV light generating device of a first embodiment.

FIG. 6 is a diagram for explaining the EUV light generating device 1 of the first embodiment.

The light source unit 41 and the light receiving unit 42 of the first embodiment may be disposed so as to satisfy condition 1 of FIG. 5.

The light source unit 41 of the first embodiment may be disposed such that the optical path of the illumination light output from the light source unit 41 passes through the first focus F1 and is included in the second region Re2.

In more detail, the light source unit 41 of the first embodiment may be disposed such that the illumination optical axis of the light source unit 41 passes through the first focus F1 and is included in the second region Re2.

The illumination optical axis may be an optical path axis of illumination light output from the light source unit 41.

Further, the light receiving unit 42 of the first embodiment may be disposed such that the optical path of the reflected light from the target 27 received by the light receiving unit 42 passes through the first focus F1 and is included in the first region Re1.

In more detail, the light receiving unit 42 of the first embodiment may be disposed such that the receiving optical axis of the light receiving unit 42 passes through the first focus F1 and is included in the first region Re1.

The receiving optical axis may be an optical path axis of light to be received by the light receiving unit 42, of the reflected light from the target 27.

The other parts of the configuration of the EUV light generating device 1 of the first embodiment may be the same as those of the EUV light generating device 1 of the comparative example.

4.2 Operation

The light source unit 41 of the first embodiment may output illumination light from the second region Re2 toward the first focus F1 and the vicinity thereof.

The light receiving unit 42 of the first embodiment may capture an image of the first focus F1 and the vicinity thereof from the first region Re1. When the illumination light is radiated to the target 27, the light receiving unit 42 may receive reflected light from the first focus F1 and the vicinity thereof toward the first region Re1, as reflected light from the target 27.

When the illumination light output from the light source unit 41 is not radiated to the target 27, the illumination light may pass through the first focus F1. The illumination light passing through the first focus F1 may not be made incident on the reflection surface 231 of the EUV focusing mirror 23, and may be radiated to the wall 2a and the like of the chamber 2 and may be scattered.

Regarding the light radiated to the wall 2a and the like of the chamber 2 and scattered, the light quantity is reduced. Accordingly, the light is less likely to reach the light receiving unit 42 and is less likely to become stray light. Even if it is received by the light receiving unit 42, the light radiated to the wall 2a and the like of the chamber 2 and scattered is less likely to affect measurement of the position, the velocity, and the target trajectory T of the target 27.

The other operations of the EUV light generating device 1 of the first embodiment may be the same as those of the EUV light generating device 1 of the comparative example.

4.3 Effect

The light source unit 41 of the first embodiment can be disposed such that stray light caused by the output illumination light is less likely to be generated.

This means that the EUV light generating device 1 of the first embodiment can suppress generation of stray light itself to thereby suppress stray light to be captured by the light receiving unit 42.

Thereby, the EUV light generating device 1 of the first embodiment can measure the target 27 supplied to the plasma generation region 25 with high accuracy.

5. Second Embodiment

An EUV light generating device 1 of a second embodiment will be described with reference to FIG. 7.

In the EUV light generating device 1 of the second embodiment, positions of the light source unit 41 and the light receiving unit 42 may be different from those of the EUV light generating device 1 of the first embodiment.

The light source unit 41 and the light receiving unit 42 of the second embodiment may be disposed so as to satisfy condition 2 of FIG. 5.

Regarding the configuration of the EUV light generating device 1 of the second embodiment, description of the same parts as the EUV light generating device 1 of the first embodiment is omitted.

5.1 Configuration

Figure 7:
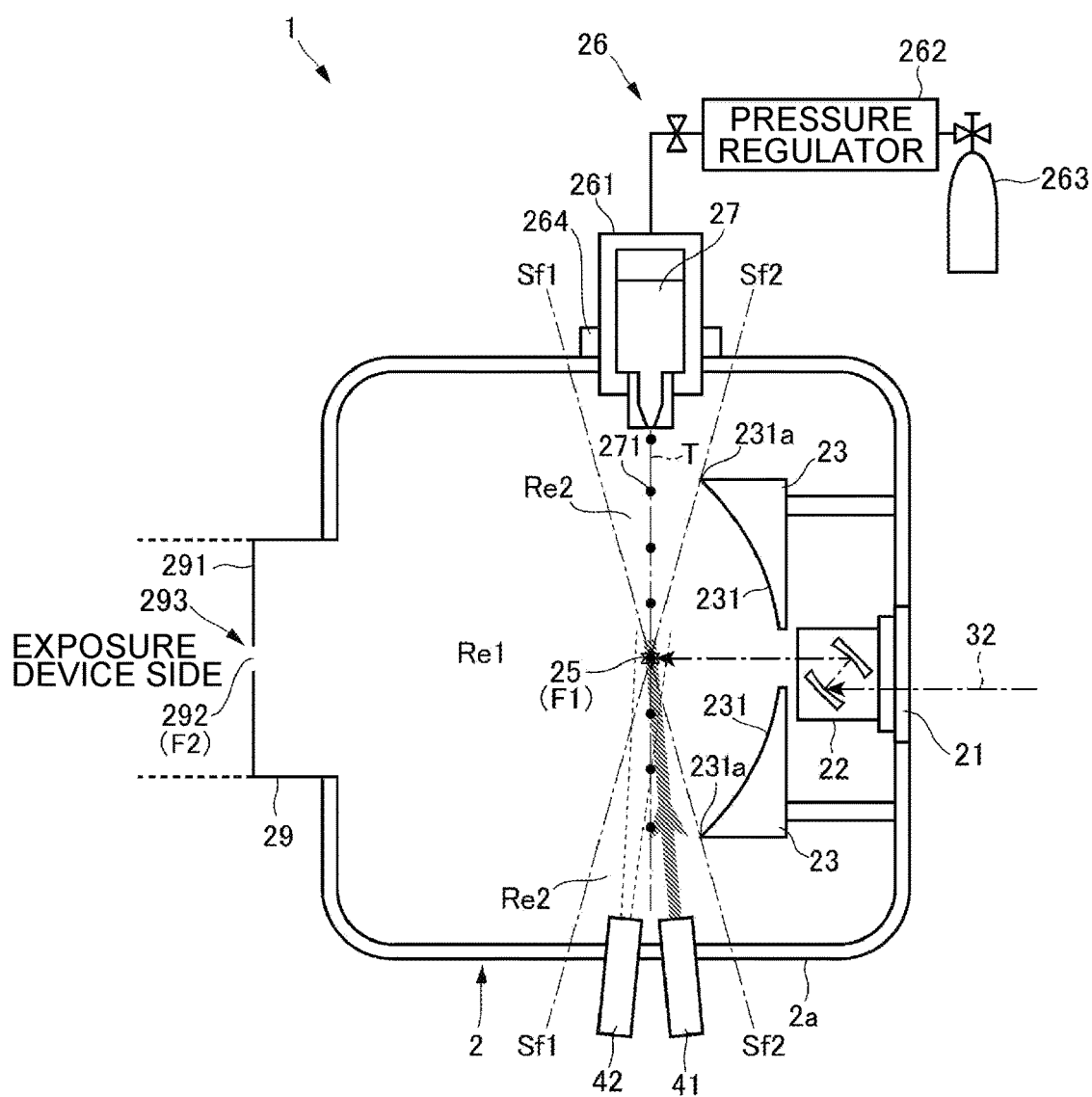
FIG. 7 is a diagram for explaining an EUV light generating device of a second embodiment.

FIG. 7 is a diagram for explaining the EUV light generating device 1 of the second embodiment.

The light source unit 41 according to the second embodiment may be disposed such that the optical path of the illumination light output from the light source unit 41 passes through the first focus F1 and is included in the second region Re2.

In more detail, the light source unit 41 of the second embodiment may be disposed such that the illumination optical axis of the light source unit 41 passes through the first focus F1 and is included in the second region Re2.

The light receiving unit 42 of the second embodiment may be disposed such that the optical path of the reflected light from the target 27 to be received by the light receiving unit 42 passes through the first focus F1 and is included in the second region Re2.

In more detail, the light receiving unit 42 of the second embodiment may be disposed such that the receiving optical axis of the light receiving unit 42 passes through the first focus F1 and is included in the second region Re2.

The other parts of the configuration of the EUV light generating device 1 of the second embodiment may be the same as those of the EUV light generating device 1 of the first embodiment.

5.2 Operation

The light source unit 41 of the second embodiment may output illumination light from the second region Re2 toward the first focus F1 and the vicinity thereof, similar to the case of the first embodiment.

The light receiving unit 42 of the second embodiment may capture an image of the first focus F1 and the vicinity thereof from the second region Re2. When the illumination light is radiated to the target 27, the light receiving unit 42 may receive reflected light from the first focus F1 and the vicinity thereof toward the second region Re2, as the reflected light from the target 27.

The illumination light output from the light source unit 41 is less likely to become stray light because, after passing through the first focus F1, it may be radiated to the wall 2a and the like of the chamber 2 and may be scattered, similar to the case of the first embodiment.

The other operations of the EUV light generating device 1 of the second embodiment may be the same as those of the EUV light generating device 1 of the first embodiment.

5.3 Effect

The light source unit 41 of the second embodiment can be disposed such that stray light caused by the output illumination light is less likely to be generated, similar to the case of the first embodiment.

Thereby, the EUV light generating device 1 of the second embodiment can suppress generation of stray light itself to thereby be able to measure the target 27 supplied to the plasma generation region 25 with high accuracy, similar to the case of the first embodiment.

6. Third Embodiment

An EUV light generating device 1 of a third embodiment will be described with use of FIG. 8.

In the EUV light generating device 1 of the third embodiment, the positions of the light source unit 41 and the light receiving unit 42 may be different from those of the EUV light generating device 1 of the first embodiment.

The light source unit 41 and the light receiving unit 42 of the third embodiment may be disposed so as to satisfy condition 3 of FIG. 5.

Regarding the configuration of the EUV light generating device 1 of the third embodiment, description of the same parts as the EUV light generating device 1 of the first embodiment is omitted.

6.1 Configuration

Figure 8:
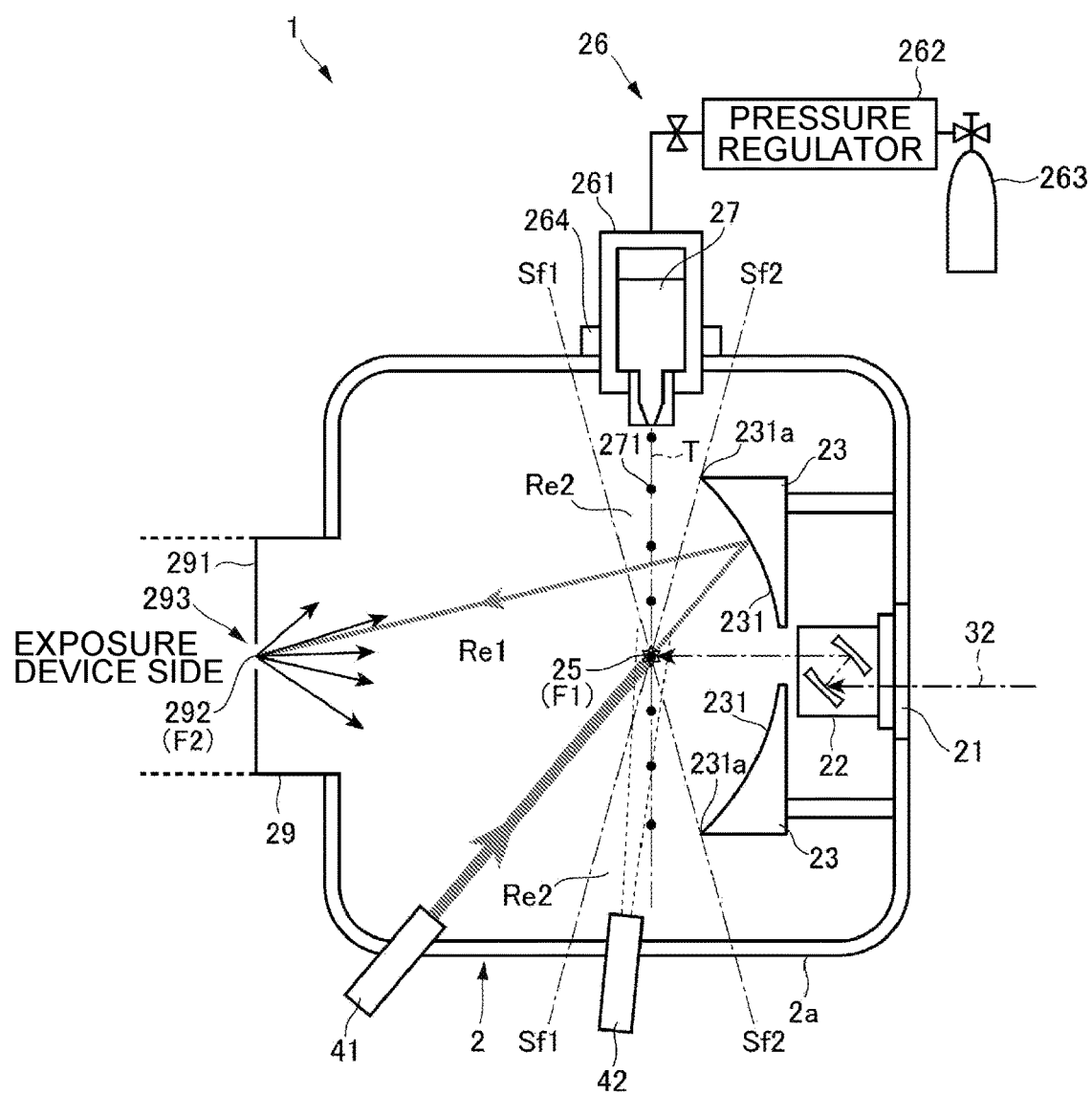
FIG. 8 is a diagram for explaining an EUV light generating device of a third embodiment.

FIG. 8 is a diagram for explaining the EUV light generating device 1 of the third embodiment.

The light source unit 41 according to the third embodiment may be disposed such that the optical path of the illumination light output from the light source unit 41 passes through the first focus F1 and is included in the first region Re1.

In more detail, the light source unit 41 of the third embodiment may be disposed such that the illumination optical axis of the light source unit 41 passes through the first focus F1 and is included in the first region Re1.

The light receiving unit 42 of the third embodiment may be disposed such that the optical path of the reflected light from the target 27 to be received by the light receiving unit 42 passes through the first focus F1 and is included in the second region Re2.

In more detail, the light receiving unit 42 of the third embodiment may be disposed such that the receiving optical axis of the light receiving unit 42 passes through the first focus F1 and is included in the second region Re2.

The other parts of the configuration of the EUV light generating device 1 of the third embodiment may be the same as those of the EUV light generating device 1 of the first embodiment.

6.2 Operation

The light source unit 41 of the third embodiment may output illumination light from the first region Re1 toward the first focus F1 and the vicinity thereof.

The light receiving unit 42 of the third embodiment may capture an image of the first focus F1 and the vicinity thereof from the second region Re2. When the illumination light is radiated to the target 27, the light receiving unit 42 may receive reflected light from the first focus F1 and the vicinity thereof toward the second region Re2, as reflected light from the target 27.

When the illumination light output from the light source unit 41 is not radiated to the target 27, it may pass through the first focus F1. The illumination light passing through the first focus F1 may be made incident on the reflection surface 231 of the EUV focusing mirror 23. The illumination light made incident on the reflection surface 231 may be reflected by the reflection surface 231, and may be scattered by the wall 291 around the second focus F2, located at the intermediate focal point 292, and the like.

Part of the scattered light caused by the wall 291 and the like may be made incident on the reflection surface 231 again and may be reflected, and may travel toward the light receiving unit 42. However, part of the scattered light caused by the wall 291 and the like is less likely to enter the view angle of the light receiving unit 42, and is less likely to be received by the light receiving unit 42. The scattered light deviated from the view angle of the light receiving unit 42 may be radiated to the wall 2a and the like of the chamber 2 and may be scattered.

Regarding the light radiated to the wall 2a and the like of the chamber 2 and scattered, the light quantity is reduced. Accordingly, the light is less likely to reach the light receiving unit 42 and is less likely to become stray light. Even if it is received by the light receiving unit 42, the light radiated to the wall 2a and the like of the chamber 2 and scattered is less likely to affect measurement of the position, the velocity, and the target trajectory T of the target 27.

The other operations of the EUV light generating device 1 of the third embodiment may be the same as those of the EUV light generating device 1 of the first embodiment.

6.3 Effect

The light receiving unit 42 of the third embodiment can be disposed such that even if light that may cause stray light, such as scattered light by the wall 291 and the like, is generated, such light is less likely to be received.

By allowing the light that may cause stray light to be less likely to be received by the light receiving unit 42, the EUV light generating device 1 of the third embodiment can suppress capturing of an image of stray light by the light receiving unit 42.

Thereby, the EUV light generating device 1 of the third embodiment can measure the target 27 supplied to the plasma generation region 25 with high accuracy.

7. Fourth Embodiment

An EUV light generating device 1 of a fourth embodiment will be described with reference to FIGS. 9 and 10.

The EUV light generating device 1 of the fourth embodiment may be different from the EUV light generating device 1 of the first embodiment in the position of the light source unit 41.

The light source unit 41 of the fourth embodiment may be disposed such that the optical path of the illumination light output from the light source unit 41 passes through the first focus F1 and is included in the second region Re2, similar to the case of the first embodiment.

In more detail, the light source unit 41 of the fourth embodiment may be disposed such that the illumination optical axis of the light source unit 41 passes through the first focus F1 and is included in the second region Re2.

However, the light source unit 41 of the fourth embodiment may be disposed in consideration of beam divergence of the illumination light output from the light source unit 41.

Regarding the configuration of the EUV light generating device 1 of the fourth embodiment, description of the same parts as the EUV light generating device 1 of the first embodiment is omitted.

7.1 Configuration

Figure 9:
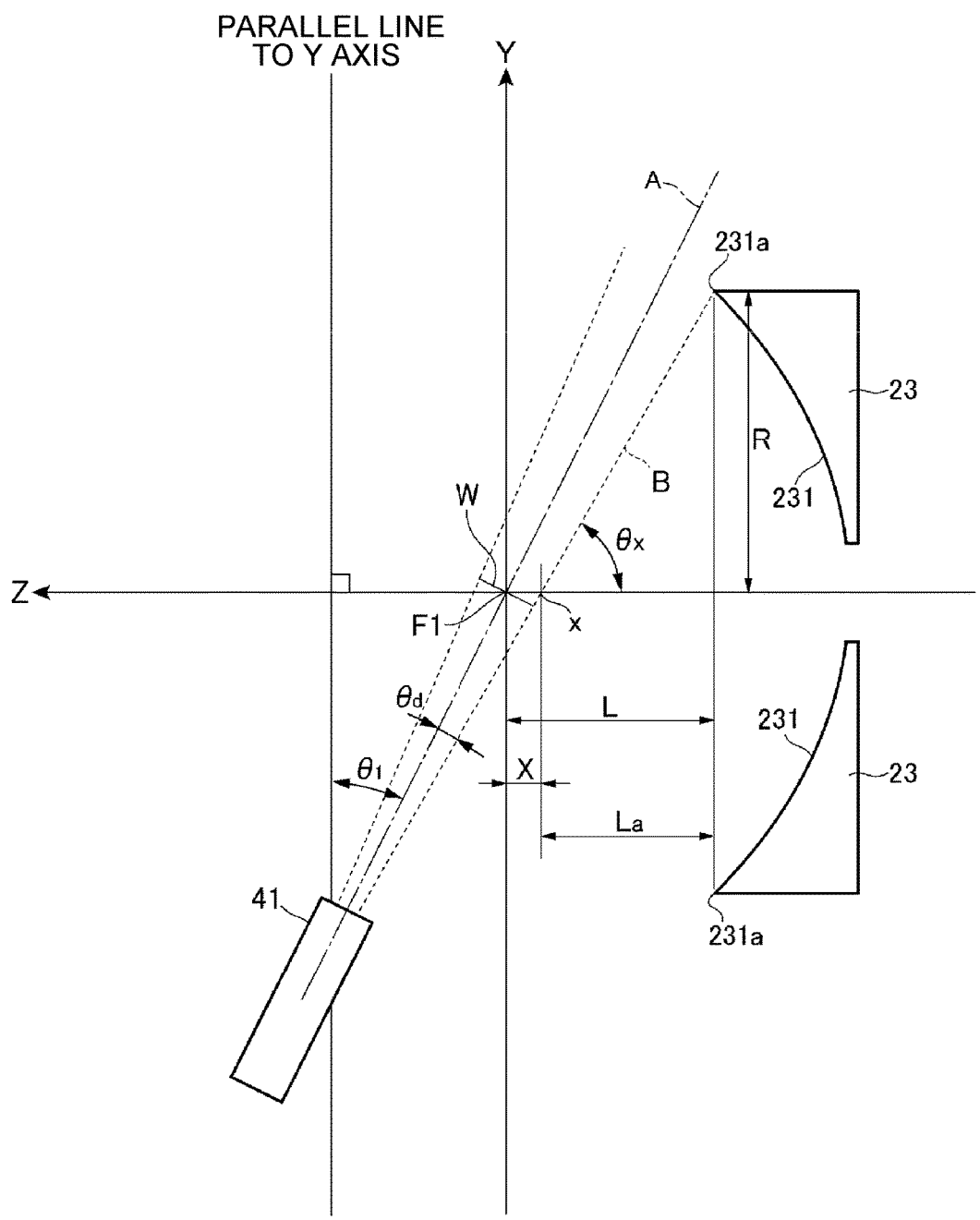
FIG. 9 is a diagram for explaining a light source unit included in an EUV light generating device of a fourth embodiment.

FIG. 9 is a diagram for explaining the light source unit 41 included in the EUV light generating device 1 of the fourth embodiment. FIG. 10 is an enlarged view illustrating the vicinity of the first focus F1 illustrated in FIG. 9.

Figure 10:
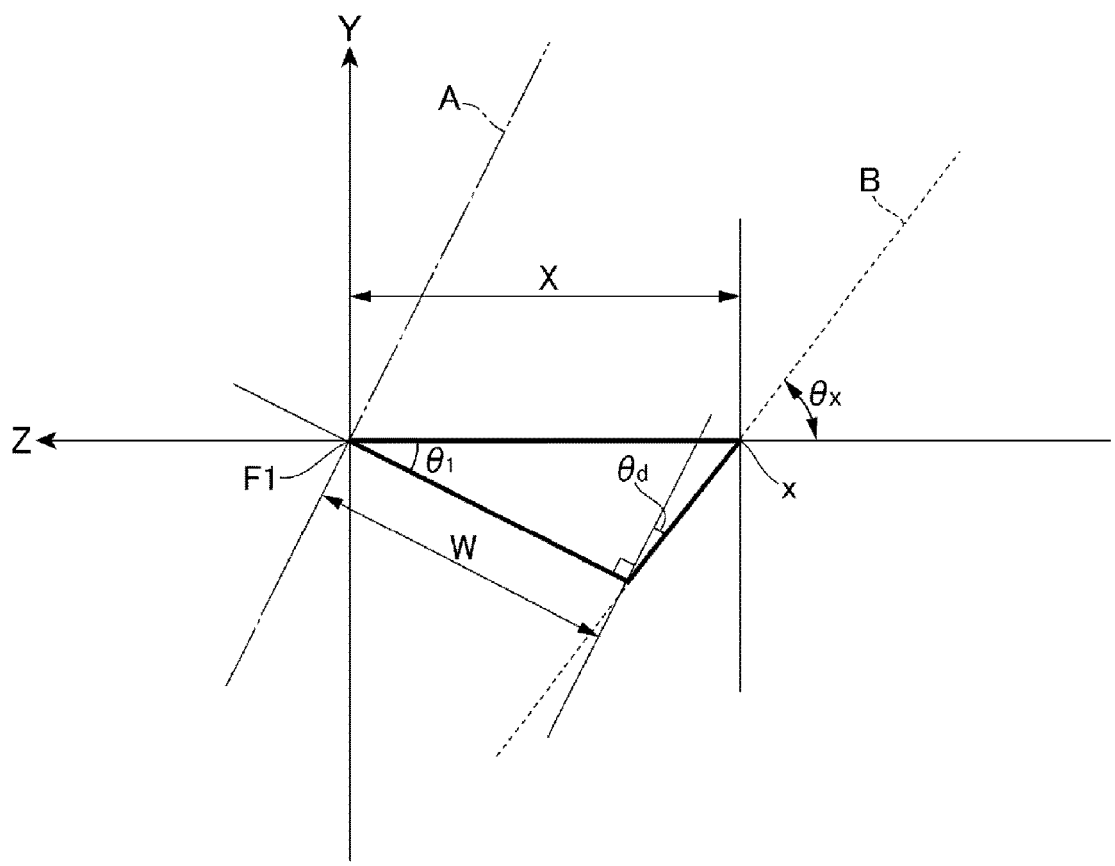
FIG. 10 is an enlarged view of a vicinity of the first focus illustrated in FIG. 9.

FIGS. 9 and 10 illustrate the case that when the light source unit 41 of the fourth embodiment outputs illumination light from the second region Re2 toward the first focus F1 and the vicinity thereof, the optical path of the illumination light passing through the first focus F1 intersects the outer peripheral edge 231a of the reflection surface 231.

Here, the illumination optical axis of the light source unit 41 is represented by A. This means that the optical path axis of the illumination light output from the light source unit 41 is represented by A.

An acute angle defined by the optical path axis A of the illumination light and the Y axis is represented by $\theta_1$.

Regarding the divergence angle of illumination light, a half value thereof is represented by $\theta_d$.

Regarding the beam width of illumination light when passing through the first focus F1, a half value thereof is represented by W. The half value W of the beam width may be a value defined by $1/(e^2)$ or $4\sigma$. The half value W of the beam width may be a beam radius of the illumination light when passing through the first focus F1.

The position where the optical path of the illumination light intersects the Z axis when passing through the first focus F1, on the reflection surface 231 side, is represented by x.

A distance from the first focus F1 to the position x is represented by X.

A line segment linking the outer peripheral edge 231a of the reflection surface 231 and the position x is represented by B.

An acute angle defined by the line segment B and the Z axis is represented by $\theta_x$.

The distance from the outer peripheral edge 231a of the reflection surface 231 to the Z axis is represented by R.

A distance from the outer peripheral edge 231a of the reflection surface 231 to the first focus F1 in the Z axis direction is represented by L. The distance L may be a distance from the outer peripheral edge 231a to the first focus F1, along the Z axis.

A distance from the outer peripheral edge 231a of the reflection surface 231 to the position x in the Z axis direction is represented by $L_a$.

Based on such a premise, when the optical path of the illumination light passing through the first focus F1 intersects the outer peripheral edge 231a of the reflection surface 231, the distance X, the distance $L_a$, and the distance L may have a relationship as Expression 3.

$$X + L_a = L \quad \text{[Expression 3]}$$

First, the distance X of the left hand of Expression 3 will be considered.

Referring to the triangle illustrated in FIG. 10, Expression 4 may be established from the sine theorem.

$$\frac{W}{\sin\theta_x} = \frac{X}{\sin\left(\frac{\pi}{2} + \theta_d\right)} \quad \text{[Expression 4]}$$

The angle $\theta_x$ may be described as Expression 5 from FIG. 10.

$$\theta_x = \frac{\pi}{2} - (\theta_1 + \theta_d) \quad \text{[Expression 5]}$$

The distance X may be described as Expression 6 when Expression 5 is substituted in Expression 4 and organized.

$$X = \frac{W\cos\theta_d}{\cos\theta_1\cos\theta_d - \sin\theta_1\sin\theta_d} \quad \text{[Expression 6]}$$

The half value $\theta_d$ of the divergence angle may be minute. As such, a trigonometric function using $\theta_d$ as a variable may be approximated by the first-order term of Taylor expansion. Then, Expression 6 may be described as Expression 7.

$$X = \frac{W}{\cos\theta_1 - \theta_d\sin\theta_1} \quad \text{[Expression 7]}$$

Next, $L_a$ of the left hand of Expression 3 will be considered.

The distance $L_a$ may be described as Expression 8 according to FIG. 9.

$$L_a = \frac{R}{\tan\theta_x} \quad \text{[Expression 8]}$$

When Expression 5 is substituted in $\theta_x$ and organized, $\tan\theta_x$ of the right hand of Expression 8 may be described as Expression 9.

$$\tan\theta_x = \frac{1 - \tan\theta_1\tan\theta_d}{\tan\theta_1 + \tan\theta_d} \quad \text{[Expression 9]}$$

The half value $\theta_d$ of the divergence angle may be minute. As such, a trigonometric function using $\theta_d$ as a variable may be approximated by the first-order term of Taylor expansion. Then, Expression 9 may be described as Expression 10.

$$\tan\theta_x = \frac{1 - \theta_d\tan\theta_1}{\tan\theta_1 + \theta_d} \quad \text{[Expression 10]}$$

The distance $L_a$ may be described as Expression 11 when Expression 10 is substituted in Expression 8 and organized.

$$L_a = R\frac{\tan\theta_1 + \theta_d}{1 - \theta_d\tan\theta_1} \quad \text{[Expression 11]}$$

Accordingly, Expression 3 may be described as Expression 12 when Expression 7 and Expression 11 are substituted in Expression 3 and organized.

$$R\frac{\tan\theta_1 + \theta_d}{1 - \theta_d\tan\theta_1} = L - \frac{W}{\cos\theta_1 - \theta_d\sin\theta_1} \quad \text{[Expression 12]}$$

By further organizing Expression 12, Expression 3 may be described as Expression 13.

$$R(\sin\theta_1 + \theta_d\cos\theta_1) = L(\cos\theta_1 - \theta_d\sin\theta_1) - W \quad \text{[Expression 13]}$$

Here, the angle $\theta_1$ may be an angle defined by the optical path axis A of the illumination light and the Y axis. $\theta$ shown in Expression 1, Expression 2, and FIG. 4 may be an angle with respect to the Z axis. The Z axis and the Y axis may intersect at right angles. Accordingly, the angle $\theta_1$ may be described as Expression 14.

$$\theta_1 = \theta - \frac{\pi}{2} \quad \text{[Expression 14]}$$

Accordingly, Expression 3 may be described as Expression 15 when Expression 14 is substituted in Expression 13 and organized.

$$R(\theta_d\sin\theta - \cos\theta) = L(\theta_d\cos\theta + \sin\theta) - W \quad \text{[Expression 15]}$$

This means that when the optical path of illumination light passing through the first focus F1 is described with use of the deflection angle $\theta$ satisfying Expression 15, the optical path of the illumination light passing through the first focus F1 may intersect the outer peripheral edge 231a of the reflection surface 231.

The distance R and the distance L according to the reflection surface 231 may be values preset by the design of the EUV focusing mirror 23.

Accordingly, when the light source unit 41 outputs illumination light from the second region Re2 to the first focus F1 and the vicinity thereof, the light source unit 41 may output illumination light such that the optical path of the illumination light passing through the first focus F1, having the half values W and $\theta_d$ of the beam width and the divergence angle, is described with use of the deflection angle $\theta$ not satisfying Expression 15.

Further, when the optical path of the illumination light passing through the first focus F1 does not intersect the reflection surface 231 including the outer peripheral edge 231a, the distance X, the distance $L_a$, and the distance L may have a relationship represented as Expression 16.

$$X + L_a < L \quad \text{[Expression 16]}$$

By developing Expression 16 according to the same idea as Expressions 4 to 15, Expression 16 may be described as Expression 17.

$$R(\theta_d\sin\theta - \cos\theta) < L(\theta_d\cos\theta + \sin\theta) - W \quad \text{[Expression 17]}$$

This means that when the optical path of illumination light passing through the first focus F1 is described with use of the deflection angle $\theta$ satisfying Expression 17, the optical path of the illumination light passing through the first focus F1 may not intersect the reflection surface 231 including the outer peripheral edge 231a even in consideration of the beam divergence of the illumination light.

Accordingly, when the light source unit 41 outputs illumination light from the second region Re2 to the first focus F1 and the vicinity thereof, the light source unit 41 may output illumination light such that the optical path of the illumination light passing through the first focus F1, having the half values W and $\theta_d$ of the beam width and the divergence angle, is described with use of the deflection angle $\theta$ satisfying Expression 17.

In other words, the light source unit 41 according to the fourth embodiment may be disposed such that the optical path of the illumination light output from the light source unit 41 passes through the first focus F1 and is included in the internal space of the chamber 2 described with use of the deflection angle θ satisfying Expressions 2 and 17.

The other parts of the configuration of the EUV light generating device 1 of the fourth embodiment may be the same as those of the EUV light generating device 1 of the first embodiment.

Regarding the operations of the EUV light generating device 1 of the fourth embodiment, description of the same operations as the EUV light generating device 1 of the first embodiment is omitted.

7.2 Effect

The light source unit 41 of the fourth embodiment can be disposed such that stray light caused by the output illumination light is less likely to be generated, even in consideration of the beam divergence of the illumination light.

Thereby, the EUV light generating device 1 of the fourth embodiment can suppress generation of stray light itself to thereby be able to measure the target 27 supplied to the plasma generation region 25 with high accuracy.

8. Others

It will be obvious to those skilled in the art that the techniques of the embodiments described above are applicable to each other including modifications.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, a modifier "a/an" described in the present description and in the accompanying claims should be construed to mean "at least one" or "one or more".

What is claimed is:

1. An extreme ultraviolet light generating device comprising:
   a chamber in which extreme ultraviolet light is generated from a target supplied to a generation region;
   a focusing mirror configured to reflect the extreme ultraviolet light, generated in the generation region, by a reflection surface, and focus the extreme ultraviolet light at a predetermined focal point, the predetermined focal point being located farther from the reflection surface than the generation region;
   a light source unit connected with the chamber, the light source unit being configured to output illumination light toward the target to be supplied to the generation region; and
   a light receiving unit connected with the chamber, the light receiving unit being configured to receive reflected light from the target, of the illumination light output toward the target, and capture an image of the target,
   the reflection surface of the focusing mirror having a spheroidal face that defines a first focus at the generation region and a second focus at the predetermined focal point, and the light source unit and the light receiving unit being disposed such that at least one of an optical path of the illumination light and an optical path of the reflected light is included in an internal space of the chamber located between a first limit surface and a second limit surface; assuming that a surface formed when an extended line, on the first focus side, of a line segment linking an outer peripheral edge of the reflection surface and the first focus is rotated about an axis passing through the first focus and the second focus, is the first limit surface, and assuming that a surface formed when the line segment linking the outer peripheral edge of the reflection surface and the first focus, and an extended line, on the outer peripheral side, of the line segment, are rotated about the axis passing through the first focus and the second focus, is the second limit surface.

2. The extreme ultraviolet light generating device according to claim 1, wherein,
   in a case of describing the internal space of the chamber with use of a polar coordinate system in which the first focus is a polar, a distance from the polar is a radius vector, and an angle of the radius vector with respect to the axis passing through the first focus and the second focus is an deflection angle θ [rad],
   assuming that an acute angle defined by the line segment linking the outer peripheral edge of the reflection surface and the first focus and the axis passing through the first focus and the second focus is represented by $θ_m$,
   assuming that a region included in the internal space satisfying a relationship of $0<θ≤θ_m$ is a first region, and
   assuming that a region included in the internal space satisfying a relationship of $θ_m<θ<(π-θ_m)$ is a second region,
   the light source unit and the light receiving unit are disposed such that at least one of the optical path of the illumination light and the optical path of the reflected light is included in the second region.

3. The extreme ultraviolet light generating device according to claim 2, wherein
   the light source unit is disposed such that the optical path of the illumination light passes through the first focus and is included in the second region, and
   the light receiving unit is disposed such that the optical path of the reflected light passes through the first focus and is included in the first region.

4. The extreme ultraviolet light generating device according to claim 3, wherein,
   assuming that a half value of a divergence angle of the illumination light is represented by $θ_d$,
   assuming that a half value of a beam width of the illumination light passing through the first focus is represented by W,
   assuming that a distance from the outer peripheral edge of the reflection surface to the axis passing through the first focus and the second focus is represented by R, and
   assuming that a distance from the outer peripheral edge of the reflection surface to the first focus in a direction along the axis passing through the first focus and the second focus is represented by L,
   the light source unit is disposed such that the optical path of the illumination light is included in the internal space described by the deflection angle θ satisfying a relationship of $$R(θ_d \sin θ - \cos θ) < L(θ_d \cos θ + \sin θ) - W.$$

5. The extreme ultraviolet light generating device according to claim 2, wherein the light source unit is disposed such that the optical path of the illumination light passes through the first focus and is included in the second region, and the light receiving unit is disposed such that the optical path of the reflected light passes through the first focus and is included in the second region.

6. The extreme ultraviolet light generating device according to claim 2, wherein the light source unit is disposed such that the optical path of the illumination light passes through the first focus and is included in the first region, and the light receiving unit is disposed such that the optical path of the reflected light passes through the first focus and is included in the second region.

* * * * *